(12) United States Patent
Zhang et al.

(10) Patent No.: US 11,365,960 B1
(45) Date of Patent: Jun. 21, 2022

(54) XY MACRO-MICRO MOTION STAGE AND CONTROL METHOD THEREOF BASED ON END FEEDBACK

(71) Applicant: GUANGDONG UNIVERSITY OF TECHNOLOGY, Guangzhou (CN)

(72) Inventors: Lanyu Zhang, Guangzhou (CN); Jian Gao, Guangzhou (CN); Junlang Liang, Guangzhou (CN); Yun Chen, Guangzhou (CN); Yunbo He, Guangzhou (CN); Xin Chen, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/581,245

(22) Filed: Jan. 21, 2022

(51) Int. Cl.
*G01B 5/008* (2006.01)
*G01B 5/00* (2006.01)
*G01B 3/00* (2006.01)

(52) U.S. Cl.
CPC .......... *G01B 5/0021* (2013.01); *G01B 3/008* (2013.01); *G01B 5/0007* (2013.01)

(58) Field of Classification Search
CPC ............................. G01B 5/008; G01B 5/0007
USPC ......................................................... 33/1 M
See application file for complete search history.

(56) References Cited

U.S. PATENT DOCUMENTS

| 5,760,500 | A * | 6/1998 | Kondo | H02K 41/02 310/12.21 |
| 6,434,840 | B1 * | 8/2002 | Jourtchenko | G12B 5/00 33/1 M |
| 6,688,016 | B2 * | 2/2004 | Suhara | H05K 13/0813 33/645 |
| 6,817,104 | B2 * | 11/2004 | Kaneko | B23Q 1/34 33/573 |
| 6,920,696 | B2 * | 7/2005 | Sawada | H02N 2/0095 977/872 |
| 7,152,331 | B2 * | 12/2006 | Nakamura | G03F 7/70058 33/573 |
| 7,319,815 | B2 * | 1/2008 | Seo | H04N 5/23248 359/554 |
| 7,440,687 | B2 * | 10/2008 | Seo | G02B 27/646 359/554 |
| 8,823,309 | B2 * | 9/2014 | Ogawa | H01J 37/20 355/72 |
| 11,156,446 | B2 * | 10/2021 | Kanbe | G01B 21/045 |
| 2012/0145920 | A1 | 6/2012 | Ogawa et al. | |
| 2012/0173193 | A1 * | 7/2012 | Chang | G01B 11/005 33/503 |

FOREIGN PATENT DOCUMENTS

| CN | 102543217 A | 7/2012 |
| CN | 103982756 A | 8/2014 |
| CN | 104440345 A | 3/2015 |

(Continued)

*Primary Examiner* — George B Bennett

(57) ABSTRACT

An XY macro-micro motion stage and a control method thereof based on end feedback. The XY macro-micro motion stage includes a fine-adjusting assembly, a macro-driving assembly and an XY position detecting device. The macro-driving assembly includes an X-direction macro-driving unit, a Y-direction macro-driving unit, an X-direction mounting plate and a Y-direction mounting plate. The XY position detecting device is configured to obtain its position on the X axis and Y axis.

7 Claims, 4 Drawing Sheets

(56) References Cited

FOREIGN PATENT DOCUMENTS

| | | | |
|---|---|---|---|
| CN | 107979223 | A | 5/2018 |
| CN | 109676403 | A | 4/2019 |
| CN | 110434835 | A | 11/2019 |
| CN | 111421228 | A | 7/2020 |
| JP | 2007109810 | A | 4/2007 |

\* cited by examiner

XY MACRO-MICRO MOTION STAGE AND CONTROL METHOD THEREOF BASED ON END FEEDBACK

CROSS-REFERENCE TO RELATED APPLICATIONS

This application claims the benefit of priority from Chinese Patent Application No. 202110239657.3, filed on Mar. 4, 2021. The content of the aforementioned application, including any intervening amendments thereto, is incorporated herein by reference.

TECHNICAL FIELD

This application relates to transmission devices, and more particularly to an XY macro-micro motion stage and a control method thereof based on end feedback.

BACKGROUND

The existing macro-micro processing equipment generally has a multi-level structure design. With respect to the XY two-dimensional macro-micro motion, due to the current arrangement requirements of driving components and sensor components, the XY macro-micro structure will inevitably suffer the error accumulation caused by the multi-level series connection, which will greatly influence the positioning accuracy of an operating end. At the same time, owing to the cross-arrangement coupling of the driving components and the sensor components, the current structure cannot achieve the full-stroke and closed-loop precision feedback of the operating end, which hinders the acquisition of the actual position information of the end and the implementation of the control method, affecting the operation accuracy.

SUMMARY

An object of this disclosure is to provide an XY macro-micro motion stage, in which a micro-motion unit bearing structure is mounted on an X-direction micro-motion unit and a Y-direction micro-motion unit connected with each other through a sliding pair to form a fine-adjusting assembly, and then the fine-adjusting assembly is arranged on a macro-driving assembly with coarse positioning function to achieve a decoupling arrangement of the whole XY macro-micro motion stage between an X-direction motion and a Y-direction motion.

This disclosure also provides a control method of the XY macro-micro motion stage based on operating end feedback, in which the precise positioning is achieved using the decoupling arrangement of the XY macro-micro motion stage between an X-direction motion and a Y-direction motion.

The technical solutions of the disclosure are described below.

In a first aspect, the disclosure provides an XY macro-micro motion platform, comprising:

a fine-adjusting assembly;
a macro-driving assembly; and
an XY position detecting device;

wherein the fine-adjusting assembly comprises an X-direction micro-motion unit, a Y-direction micro-motion unit and a micro-motion unit bearing structure;

an output end of the X-direction micro-motion unit has a loading function and is connected to the XY position detecting device; the X-direction micro-motion unit is configured to drive a load and the XY position detecting device to move along an X-axis direction; an output end of the Y-direction micro-motion unit is connected to the X-direction micro-motion unit; and the Y-direction micro-motion unit is configured to drive the X-direction micro-motion unit to move along a Y-axis direction;

the macro-driving assembly comprises an X-direction macro-driving unit, a Y-direction macro-driving unit, an X-direction mounting plate and a Y-direction mounting plate;

two ends of the X-direction mounting plate are respectively connected with the Y-direction macro-driving unit to drive the X-direction mounting plate to move along the Y-axis direction; the micro-motion unit bearing structure is movably connected to a middle portion of the X-direction mounting plate; and a first moving pair extending along the X-axis direction is formed between the X-direction mounting plate and the micro-motion unit bearing structure;

two ends of the Y-direction mounting plate are respectively connected with the X-direction macro-driving unit to drive the Y-direction mounting plate to move along the X-axis direction; the micro-motion unit bearing structure is movably connected to a middle portion of the Y-direction mounting plate; and a first moving pair extending along the Y-axis direction is formed between the Y-direction mounting plate and the micro-motion unit bearing structure; and an XY encoder of the XY position detecting device is mounted on an operating end of the X-direction micro-motion unit, and configured to obtain a position of all motion units on an X axis and a Y axis.

In an embodiment, the X-direction micro-motion unit comprises an X-direction micro-motion block with a moving function;

the Y-direction micro-motion unit comprises a Y-direction micro-motion block with a moving function;

the X-direction micro-motion block is connected to the XY position detecting device, and is provided with an X-direction limit head; the Y-direction micro-motion block is provided with a first micro-motion limit groove; the micro-motion unit bearing structure is provided with a second micro-motion limit groove; and the X-direction limit head extends into and is movable in the first micro-motion limit groove and the second micro-motion limit groove;

the X-direction micro-motion block and the Y-direction micro-motion block are movably connected; a second moving pair extending along the X-axis direction is formed between the X-direction micro-motion block and the Y-direction micro-motion block; and the Y-direction micro-motion block is movably connected with the micro-motion unit bearing structure; a second moving pair extending along the Y-axis direction is formed between the Y-direction micro-motion block and the micro-motion unit bearing structure.

In an embodiment, the XY position detecting device comprises a measuring data receiving device and a measuring data transmitting device; and the measuring data receiving device is arranged on the X-direction micro-motion block, and is movable inside and/or outside a surface of the measuring data transmitting device; and the measuring data receiving device is movable on the surface of the measuring data transmitting device to acquire a position of the measuring data receiving device on an X axis and Y axis of the measuring data transmitting device.

In an embodiment, the X-direction micro-motion block is provided with a top limit end with a bearing function at an upper end of the X-direction limit head;

a bottom of the top limit end abuts against an upper surface of the Y-direction micro-motion block; and a bottom of the Y-direction micro-motion block abuts against an upper surface of the micro-motion unit bearing structure; and the measuring data receiving device is arranged at a lower end of the X-direction limit head.

In an embodiment, the measuring data receiving device and the measuring data transmitting device are in contact with each other through planes arranged opposite to each other.

In an embodiment, the XY macro-micro motion stage further comprises:

an industrial computer;

wherein the industrial computer is in communication connection with the XY position detecting device; the industrial computer is configured to control the X-direction micro-motion unit, the Y-direction micro-motion unit, the X-direction macro-driving unit and the Y-direction macro-driving unit.

In a second aspect, the present disclosure provides a method for controlling the XY macro-micro motion stage based on end feedback, comprising:

(S1) controlling, by the industrial computer, the X-direction macro-driving unit and the Y-direction macro-driving unit to realize a coarse positioning of a macro motion of the X-direction micro-motion unit along the X-axis direction and the Y-axis direction; and (S2) feeding a precise position information acquired by the XY position detecting device back to the industrial computer; and when an absolute value of a difference between a target position A' and an actual position A is outside an accuracy range, performing, by the industrial computer, a fine positioning on a micro motion of the X-direction micro-motion unit along the X-axis direction and a micro motion of the Y-direction micro-motion unit along the Y-axis direction until the absolute value of the difference between the target position A' and the actual position A is within the accuracy range.

In an embodiment, in step (S2), the fine positioning of the micro motion of the X-direction micro-motion unit along the X-axis direction is performed through steps of:

setting, by the industrial computer, an X-direction macro-motion target position to the X-direction macro-driving unit, and inputting a designed control signal to allow the X-direction macro-driving unit to move; and reading an actual position H2 of the X-direction macro-driving unit; when an absolute value of a difference between the target position H1 and the actual position H2 is within an accuracy range E, keeping the X-direction macro-driving unit stationary, and starting the X-direction micro-motion unit to perform fine positioning; and when the absolute value of the difference between the target position H1 and the actual position H2 is outside the accuracy range E, keeping moving the X-direction macro-driving unit until the absolute value of the difference between the target position H1 and the actual position H2 is within the accuracy range E; and when the X-direction micro-motion unit is started, setting, by the industrial computer, an X-direction micro target position W1 to the X-direction micro-motion unit; acquiring, by the measuring data receiving device, an actual position W2 of the X-direction micro-motion unit along the X-axis direction; when an absolute value of a difference between the target position W1 and the actual position W2 is within an accuracy range e, stopping moving the X-direction micro-motion unit; when the absolute value of the difference between the target position W1 and the actual position W2 is outside the accuracy range e, keeping moving the X-direction micro-driving unit until the absolute value of the difference between the target position W1 and the actual position W2 is within the accuracy range e.

In an embodiment, in step (S2), the fine positioning of the micro motion of the Y-direction micro-motion unit along the Y-axis direction is performed through steps of:

setting, by the industrial computer, a Y-direction macro-motion target position H3 to the Y-direction macro-driving unit, and inputting a designed control signal to allow the Y-direction macro-driving unit to move; reading an actual position H4 of the Y-direction macro-driving unit; when an absolute value of a difference between the target position H3 and the actual position H4 is within an accuracy range E1, keeping the Y-direction macro-driving unit stationary, and starting the Y-direction micro-motion unit to perform fine positioning;

when the absolute value of the difference between the target position H3 and the actual position H4 is outside the accuracy range E1, moving the Y-direction macro-driving unit until the absolute value of the difference between the target position H3 and the actual position H4 is within the accuracy range E1; and when the Y-direction micro-motion unit is started up, setting, by the industrial computer, a Y-direction micro-motion target position W3 to the Y-direction micro-motion unit; acquiring, by the XY position detecting device, an actual position W4 of the Y-direction micro-motion unit along the Y-axis direction; when an absolute value of a difference between the target position W3 and the actual position W4 is within an accuracy range e1, a precision positioning operation is achieved; and when the absolute value of the difference between the target position W3 and the actual position W4 is outside the accuracy range e1, keeping moving the Y-direction micro-motion unit until the absolute value of the difference between the target position W3 and the actual position W4 is within the accuracy range e1.

Compared to the prior art, the present disclosure has the following beneficial effects.

The XY macro-micro motion stage provided herein adopts an XY macro-micro decoupling mode. Specifically, a macro-motion part and a micro-motion part on the same axial direction are in a decoupling arrangement, and based on this, a decoupling arrangement is also designed between an X-direction motion and a Y-direction motion such that the entire system forms a common horizontal plane in the X-axis and Y-axis directions and achieves the decoupling between the macro motion and the micro motion. In addition, motions along the X-axis and Y-axis directions are not structurally coupled with each other, and the accurate position on the X-axis and Y-axis can be obtained without complex coordinate transformation. At the same time, the XY macro-micro motion stage moves on the same horizontal plane, which can reduce tangential interference and influence to arrive at a precise motion.

Figure 1:
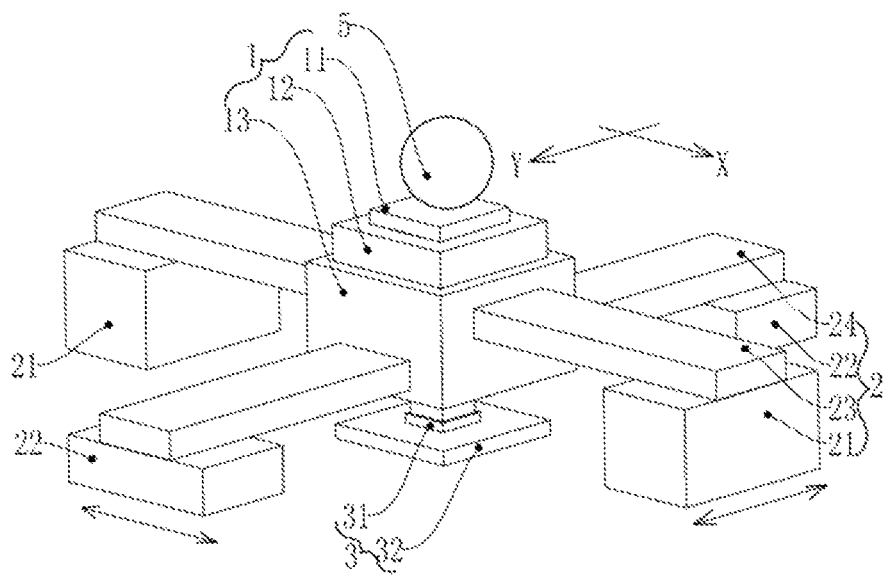
FIG. 1 is a structural diagram of an XY macro-micro motion stage according to an embodiment of the present disclosure.
Figure 2:
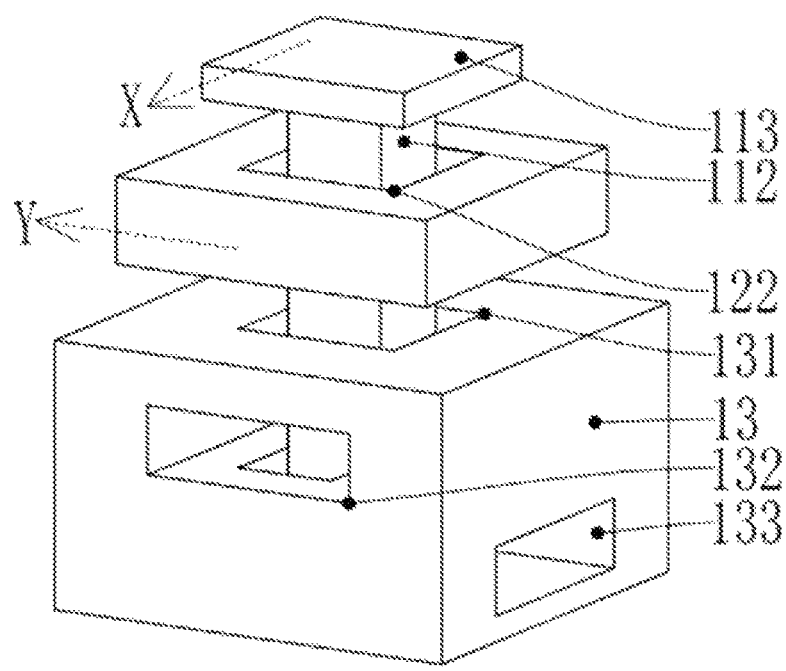
FIG. 2 is a structural diagram of a fine-adjusting assembly according to an embodiment of the present disclosure.
Figure 3:
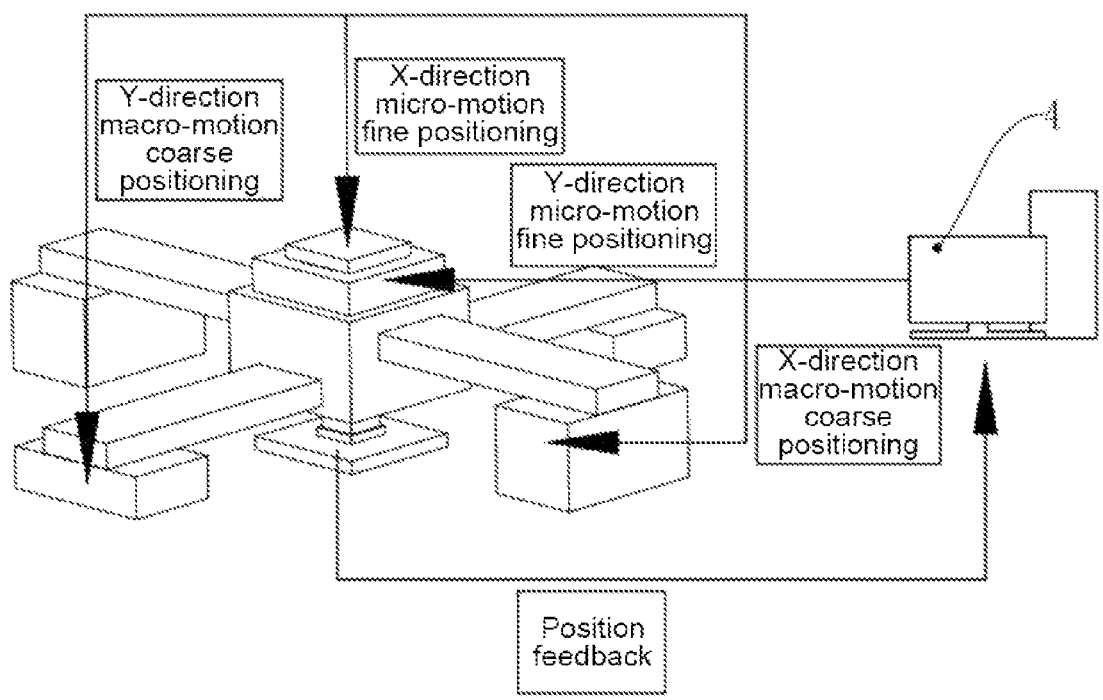
FIG. 3 schematically illustrates a control process of the XY macro-micro motion stage according to an embodiment of the present disclosure.

In the drawings, 1, fine-adjusting assembly; 2, macro-driving assembly; 3, XY position detecting device; 4, industrial computer; 5, load; 11, X-direction micro-motion unit; 12, Y-direction micro-motion unit; 13, micro-motion unit bearing structure; 21, X-direction macro-driving unit; 22, Y-direction macro-driving unit; 23, X-direction mounting plate; 24, Y-direction mounting plate; 112, X-direction limit head; 113, top limit end; 122, first micro-motion limit groove; 131, second micro-motion limit groove; 31, measuring data receiving device; and 32, measuring data transmitting device.

DETAILED DESCRIPTION OF EMBODIMENTS

Technical solutions of the present disclosure will be described in detail below with reference to the accompanying drawings and embodiments.

An XY macro-micro motion stage is provided herein, which includes a fine-adjusting assembly 1, a macro-driving assembly 2 and an XY position detecting device 3.

The fine-adjusting assembly includes an X-direction micro-motion unit 11, a Y-direction micro-motion unit 12 and a micro-motion unit bearing structure 13.

The X-direction micro-motion unit 11 and the Y-direction micro-motion unit 12 both have a driving function. An output end of the X-direction micro-motion unit 11 has a loading function and is connected to the XY position detecting device 3. The X-direction micro-motion unit 11 is configured to drive a load and the XY position detecting device to move along X-axis direction. An output end of the Y-direction micro-motion unit 12 is connected to the X-direction micro-motion unit 11. The Y-direction micro-motion unit 12 is configured to drive the X-direction micro-motion unit 11 to move along a Y-axis direction.

The macro-driving assembly 2 includes an X-direction macro-driving unit 21, a Y-direction macro-driving unit 22, an X-direction mounting plate 23 and a Y-direction mounting plate 24.

Two ends of the X-direction mounting plate 23 are respectively connected with the Y-direction macro-driving unit 21, for driving the X-direction mounting plate 23 to move along the Y-axis direction. The micro-motion unit bearing structure 13 is movably connected to a middle portion of the X-direction mounting plate. A first moving pair extending along the X-axis direction is formed between the X-direction mounting plate 23 and the micro-motion unit bearing structure 13.

Two ends of the Y-direction mounting plate 24 are respectively connected with the X-direction macro-driving unit 22. The Y-direction macro-driving unit 22 is configured to drive the Y-direction mounting plate 24 to move along the X-axis direction. The micro-motion unit bearing structure 13 is movably connected to a middle portion of the Y-direction mounting plate 24. A moving pair extending along the Y-direction is formed between the Y-direction mounting plate 24 and the micro-motion unit bearing structure 13.

The XY position detecting device is configured to acquire a full-travel and online closed-loop two-dimensional position information on an X axis and a Y axis in real time under the combined driving of the X-direction macro-driving unit, the X-direction micro-motion unit, the Y-direction macro-driving unit and the Y-direction micro-motion unit. The online closed-loop refers to the XY macro-micro motion stage moving while acquiring and feeding a position information back to the industrial computer or other control equipment to achieve a better control effect.

The XY macro-micro motion stage provided herein adopts an XY macro-micro decoupling mode. Specifically, a macro-motion part and a micro-motion part on the same axial direction are in a decoupling arrangement, and based on this, a decoupling arrangement is also designed between an X-direction motion and a Y-direction motion such that the entire system forms a common horizontal plane in the X-axis and Y-axis directions and achieves the decoupling between the macro motion and the micro motion. In addition, motions along the X-axis and Y-axis directions are not structurally coupled with each other, and the accurate position on the X-axis and Y-axis can be obtained without complex coordinate transformation. At the same time, the XY macro-micro motion stage moves on the same horizontal plane, which can reduce tangential interference and influence and thus arrive at a precise motion.

In an embodiment, the X-direction macro-driving unit 21 and the Y-direction macro-driving unit 22 are known and respectively configured to drive the X-direction mounting plate 23 and the Y-direction mounting plate 24 to move, which can be a linear motor, a ball screw, a cylinder, or an oil cylinder.

The moving pair is a motion pair with a degree of freedom of 1, which can be understood as a fit between a slide block and a guide rail. For example, in this embodiment, the micro-motion unit bearing structure 13 is provided with an X-direction track 132 parallel to the X axis and a Y-direction track 133 parallel to the Y axis. Preferably, an angle between the X-direction track 132 and Y-direction track 133 is 90°. The X-direction mounting plate 23 is arranged on the X-direction track 132, and the Y-direction mounting plate 24 is arranged on the Y-direction track 133. Under the guidance of the X-direction track 132 and the Y-direction track 133, the X-direction mounting plate 23 can move along the X-axis direction, and the Y-direction mounting plate 24 can move along the Y-axis direction. Hence, when the Y-direction position of the X-direction mounting plate 23 needs to be adjusted, the X-direction macro-driving unit 21 is started to drive the X-direction mounting plate 23 to extend along the Y-axis direction. Moreover, the X-direction track 132 extends along the X-axis direction such that the X-direction mounting plate 23 can drive the micro-motion unit bearing structure 13 to move along the Y-axis direction. As the micro-motion unit bearing structure 13 is provided with the Y-direction track 133 parallel to the Y-axis direction, the Y-direction mounting plate 24 arranged on the Y-direction track 133 can provide a guidance for the Y-direction movement of the micro-motion unit bearing structure 13 and improve the movement fluency of the micro-motion unit bearing structure 13. At this time, the Y-direction macro-driving unit is started to drive the Y-direction mounting plate 24 to move along the X-axis direction, then drive the micro-motion unit bearing structure 13 to move along the X-axis direction, and provide a guidance for the X-direction movement of the micro-motion unit bearing structure 13 through the X-direction mounting plate 23 arranged on the X-direction track 132. The position detection device 3 of the micro-motion unit bearing structure 13 can complete the coarse positioning under the combined action of the X-direction macro-driving unit 21 and the Y-direction macro-driving unit 22. The X-direction micro-motion unit 11 and the Y-direction micro-motion unit are started, the X-direction micro-motion unit 12 drives the X-direction micro-motion unit 11 to move, and then drives the XY position detecting device 3 to move along the Y-axis direction. The X-direction micro-motion unit 11 has a driving function, can drive the XY position detecting device 3 to move along the X-axis direction and realize the accurate positioning of the XY position detecting device 3 on the X and Y axes. In summary, a XY macro-micro decoupling mode is adopted in this embodiment. Specifically, a macro-motion part and a micro-motion part on the same axial direction are in a decoupling arrangement, and based on this, a decoupling arrangement is also designed between an X-direction motion and a Y-direction motion such that the entire system forms a common horizontal plane in the X-axis and Y-axis directions and achieves the decoupling between the macro motion and the micro motion. At the same time, the XY macro-micro motion stage moves on the same horizontal plane, which can reduce tangential interference and influence and thus arrive at a precise motion.

In an embodiment, the X-directional micro-motion unit 11 includes an X-direction micro-motion block with a moving function. The Y-direction micro-motion unit 12 includes a Y-direction micro-motion block with a moving function.

The X-direction micro-motion block is connected to the XY position detecting device 3 and is provided with an X-direction limit head 112. The Y-direction micro-motion block is provided with a first micro-motion limit groove 122. The micro-motion unit bearing structure 13 is provided with a second micro-motion limit groove 131. The X-direction limit head 112 extends into and is movable in the first micro-motion limit groove 122 and the second micro-motion limit groove 131.

The X-direction micro-motion block and the Y-direction micro-motion block are movably connected. A second moving pair extending along the X-axis direction is formed between the X-direction micro-motion block and the Y-direction micro-motion block.

The Y-direction micro-motion block is movably connected with the micro-motion unit bearing structure 13 are movably connected. A second moving pair extending along the Y-axis direction is formed between the Y-direction micro-motion block and the micro-motion unit bearing structure 13.

The X-direction limit head 112 of the X-direction micro-motion block extends into the first micro-motion limit groove 122 and the second micro-motion limit groove 131, where the first moving pair between the X-direction micro-motion block and the Y-direction micro-motion block is the X axis. As the limitation of the X-direction limit head 112 to the first micro-motion limit groove 122 at two ends of the X-axis, the X-direction micro-motion block can only move along the X-axis direction. The second moving pair between the Y-direction micro-motion block and the micro-motion unit bearing structure 13 extends along the Y-axis direction. After the X-direction limit head 112 extends into the second micro-motion limit groove 131, the second micro-motion limit groove 131 is limited at two ends of the Y-axis such that the Y-direction micro-motion block will move along the Y-axis direction to drive the micro-motion unit bearing structure 13 and the X-direction micro-motion block to move along the Y-axis direction. In this case, the X-direction micro-motion block provides a restriction that can only move along the X-axis direction, and the X-direction micro-motion block provides a restriction that can only move along the Y-axis direction, achieving the micro adjustment of the XY position detecting device 3 on the X axis and Y axis, thus improving the movement accuracy of the XY position detecting device 3.

In this embodiment, the X-direction micro-motion block, the Y-direction micro-motion block and the micro-motion unit bearing structure 13 are connected stackedly. Though the accurate movement of the first moving pair and the second moving pair among the X-direction micro-motion block, the Y-direction micro-motion block and the micro-motion unit bearing structure 13 to improve the movement accuracy.

The X-direction micro-motion unit 11 and the Y-direction micro-motion unit 12 both include a micro-driving device, respectively configured to move the X-direction micro-motion block and the Y-direction micro-motion block, such as a well-known piezoelectric ceramic, a magnetostrictive element and other micro-motion elements. The micro-motion element can be arranged at the X-direction micro-motion block, Y-direction micro-motion block and the micro-motion unit bearing table 13, or a position thereamong as needed. The drawings illustrate, in a form of a block structure, that the Y-direction micro-motion unit 12 is limited by the second moving pair on the micro-motion unit bearing structure 13, and the X-direction micro-motion unit 11 is limited by the first moving pair on the Y-direction micro-motion unit 12.

In an embodiment, the XY position detecting device 3 includes a measuring data receiving device 31 and a measuring data transmitting device 32.

The measuring data receiving device 31 is arranged on the X-direction micro-motion block, and is movable inside and/or outside a surface of the measuring data transmitting device 32. The measuring data receiving device 31 is movable on the surface of the measuring data transmitting device 32 to acquire a position of the measuring data receiving device on an X axis and Y axis of the measuring data transmitting device 32.

The measuring data receiving device 31 is arranged on the X-direction micro-motion block. The performed coarse positioning of the X-direction macro-driving unit 21 and the Y-direction macro-driving unit 22 are detected through the measuring data receiving device 31, and then the fine positioning is performed through the X-direction micro-motion unit 11 and the Y-direction micro-motion unit 12. The measuring data receiving sense of the measuring data receiving device 31 is more active than that of the measuring data transmitting device 32. During the movement of the measuring data transmitting device 32, the measuring data transmitting device 32 continuously transmits precision position information to the measuring data receiving device 31, and the measuring data receiving device 31 feeds the precision position information back to the industrial computer 4. The X-direction micro-motion unit 11, the Y-direction micro-motion unit 12, the X-direction macro-driving unit 21 and the Y-direction macro-driving unit 22 are controlled by the industrial computer 4 until the absolute value of the difference between the target position and the actual position is within the accuracy to complete the positioning. As the measuring data receiving device 31 is close to or in contact with the measuring data transmitting device 32, the induction time between the measuring data receiving device 31 and the measuring data transmitting device 32 can be ignored, leading to a high recognition accuracy. Moreover, the X-direction micro-motion block, the Y-direction micro-motion block and the micro-motion unit bearing structure 13 are connected stackedly, and the first moving pair and the second moving pair exist between the adjacent stack layers, ensuring the accuracy of the displacement positioning of the measuring data receiving device 31.

The measuring data receiving device 31 generally cooperates with the measuring data transmitting device 32 through a sensing function, such as a plane grating and a laser ruler. The detection accuracy of the XY position detecting device 3 is less than or equal to the resolution ratio of the XY macro-micro motion stage.

In an embodiment, the X-direction micro-motion block is provided with a top limit end 113 with a bearing function at an upper end of the X-direction limit head 112. A bottom of the top limit end 113 abuts against an upper surface of the Y-direction micro-motion block. The bottom of the Y-direction micro-motion block abuts against an upper surface of the micro-motion unit bearing structure 13.

The measuring data receiving device 31 is arranged at a lower end of the X-direction limit head 112.

The top limit end 113 has a bearing function, which can place a load 5 and ensure that the load 5 can be accurately delivered to a specific location. The load can be precision electronic devices, such as tiny transistors and small flexible robots.

The XY macro-micro motion stage can realize a macro-micro composite movement in X-axis and Y-axis directions and an online, real-time and closed-loop feedback during the whole process. A bottom of the XY macro-micro motion stage is fixedly connected to the XY position detecting device 3, and a top of the XY macro-micro motion stage is configured to place the load 5 to sense and recognize the position of the load 5 on line and in real time, thus improving the operation accuracy.

In an embodiment, the measuring data receiving device 31 and the measuring data transmitting device 32 in contact with each other through planes arranged opposite to each other.

When the X-direction limit head 112 moves, the measuring data transmitting device 32 can support the measuring data receiving device 31 upwards, further providing a support for the X-direction limit head 112. Furthermore, planar contact can enhance the movement smoothness of the measuring data receiving device 31 on the surface of the measuring data transmitting device 32, and the measuring data transmitting device 32 can support the measuring data receiving device 31, improving the movement stability and lowering the resistance of movement.

In an embodiment, the XY macro-micro motion stage further includes an industrial computer 4.

The industrial computer 4 is in communication connection with the XY position detecting device 3. The industrial computer 4 is configured to control the X-direction micro-motion unit 11, the Y-direction micro-motion unit 12, the X-direction macro-driving unit 21, and the Y-direction macro-driving unit 22.

The industrial computer 4 is configured to continuously receive precise position information, control the X-direction micro-motion unit 11, the Y-direction micro-motion unit 12, the X-direction macro-driving unit 21 and the Y-direction macro-driving unit 22 through the precise position information, feed an absolute displacement record of the macro-motion and the micro-motion back, and combine with an upper computer system to compare XY macro-micro errors to achieve the high-precision compensation. The high-precision planar positioning of the end can be achieved by the following equations, to accurately transfer the load 5 to the specified position:

$$X_{micro-motion} = X_{target} - X_{current};\ and$$

$$Y_{micro-motion} = Y_{target} - Y_{current}.$$

A method for controlling the XY macro-micro motion stage based on end feedback is also provided herein, which includes the following steps.

(S1) The X-direction macro-driving unit 21 and the Y-direction macro-driving unit 22 are controlled by the industrial computer 4 to realize a coarse positioning of a macro motion of an end of the X-direction micro-motion unit 11 along the X-axis direction and the Y-axis direction.

(S2) A precise position information acquired by the XY position detecting device 3 is fed back to the industrial computer 4. When an absolute value of a difference between a target position A' and an actual position A is outside an accuracy range, a fine positioning is performed by the industrial computer on the X-direction micro-motion unit 11 along the X-axis direction and the Y-direction micro-motion unit 12 along the Y-axis direction until the absolute value of the difference between the target position A' and an actual position A is within the accuracy range.

Due to the far distance between the position information feedback device and the terminal location, and the complex and nonlinear overall structure of the XY macro-micro motion stage, the terminal position information cannot be acquired from the position information feedback. Nevertheless, the traditional position feedback device, such as a linear grating ruler, can only observe the position information of single degree of freedom.

In the method provided herein, a bottom of the micro-motion unit is provided with a receiver of a plane detection device. The micro-motion unit bearing structure 13 is driven by the X-direction macro-driving unit and the Y-direction macro-driving unit to perform a coarse positioning along the X-axis direction and Y-axis direction. The stacked fine-adjusting assembly can realize the error decoupling, and effectively solve the contradiction among high speed, large acceleration and high precision, thereby realizing the full stroke two-dimensional closed-loop feedback control and facilitating the fine positioning of the load.

Figure 4:
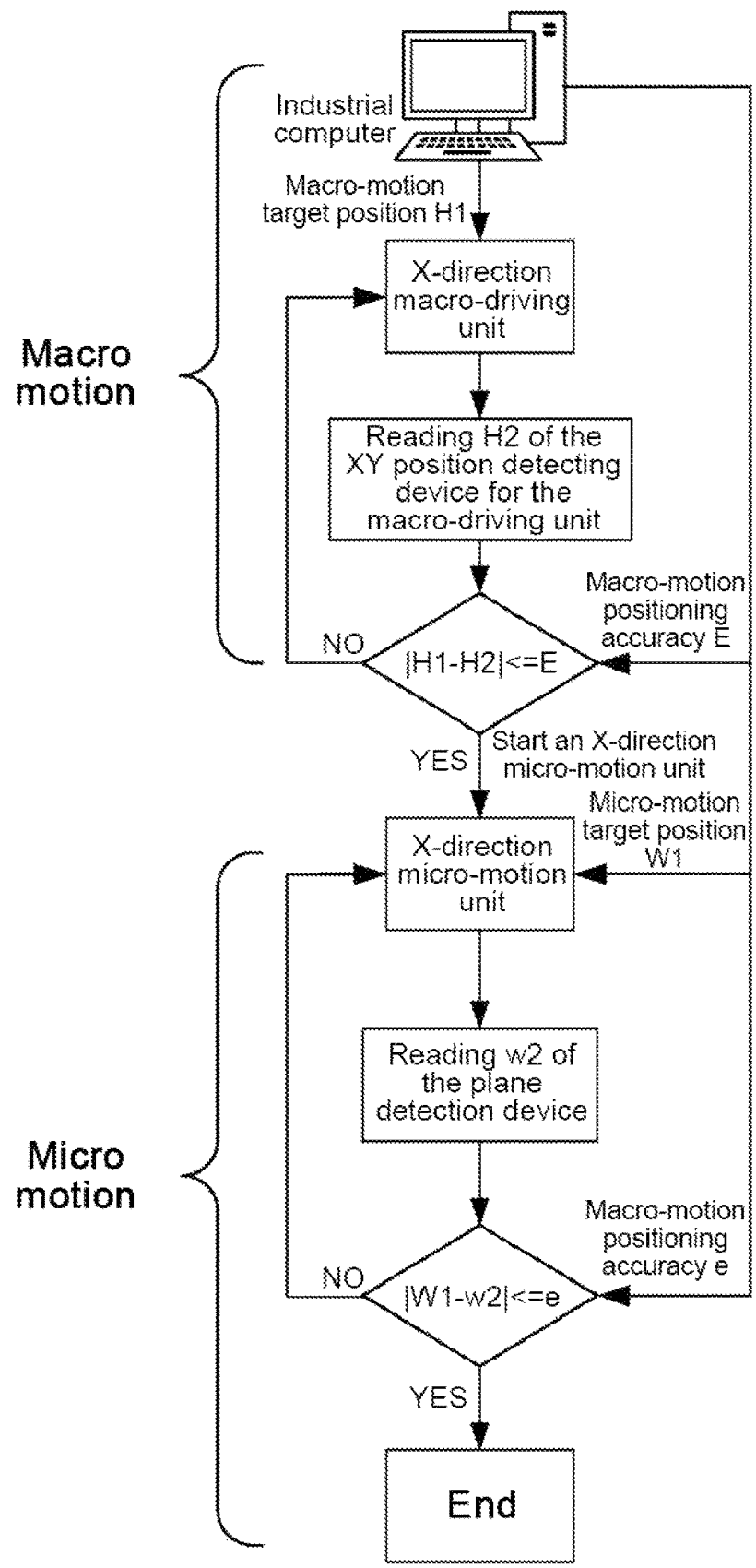
FIG. 4 is a flow chart an X-direction macro-micro fine positioning process according to an embodiment of the present disclosure.

In an embodiment, in step (S2), the fine positioning of the X-direction micro-motion unit along the X-axis direction is performed through the following steps, as shown in FIG. 4.

A final X-direction position is D1=H1+W1. The X-direction macro-driving unit 21 is controlled to move to an X-direction macro motion target position H1 set by the industrial computer 4. Then an actual position H2 is acquired through the X-direction macro-driving unit 21. When an absolute value of a difference between the target position H1 and the actual position H2 is within an accuracy range E, the X-direction macro-driving unit 21 stops moving, and the fine positioning is performed on the X-direction micro-motion unit 11. When the absolute value of the difference between the target position H1 and the actual position H2 is outside the accuracy range E, the X-direction macro-driving unit 21 keeps moving until the absolute value of the difference between the target position H1 and the actual position H2 is within the accuracy range E.

When the X-direction micro-motion unit 11 is turned on, the X-direction micro-driving unit 21 is controlled to move to an X-direction micro target position W1 set by the industrial computer. An actual position W2 is read through the measuring data receiving device 31. When an absolute value of a difference between the target position W1 and the actual position W2 is within an accuracy range e, the X-direction micro-motion unit 11 stops moving. When the absolute value of the difference between the target position W1 and the actual position W2 is outside the accuracy range e, the X-direction micro-driving unit 21 keeps moving until the absolute value of the difference between the target position W1 and the actual position W2 is within the accuracy range.

Figure 5:
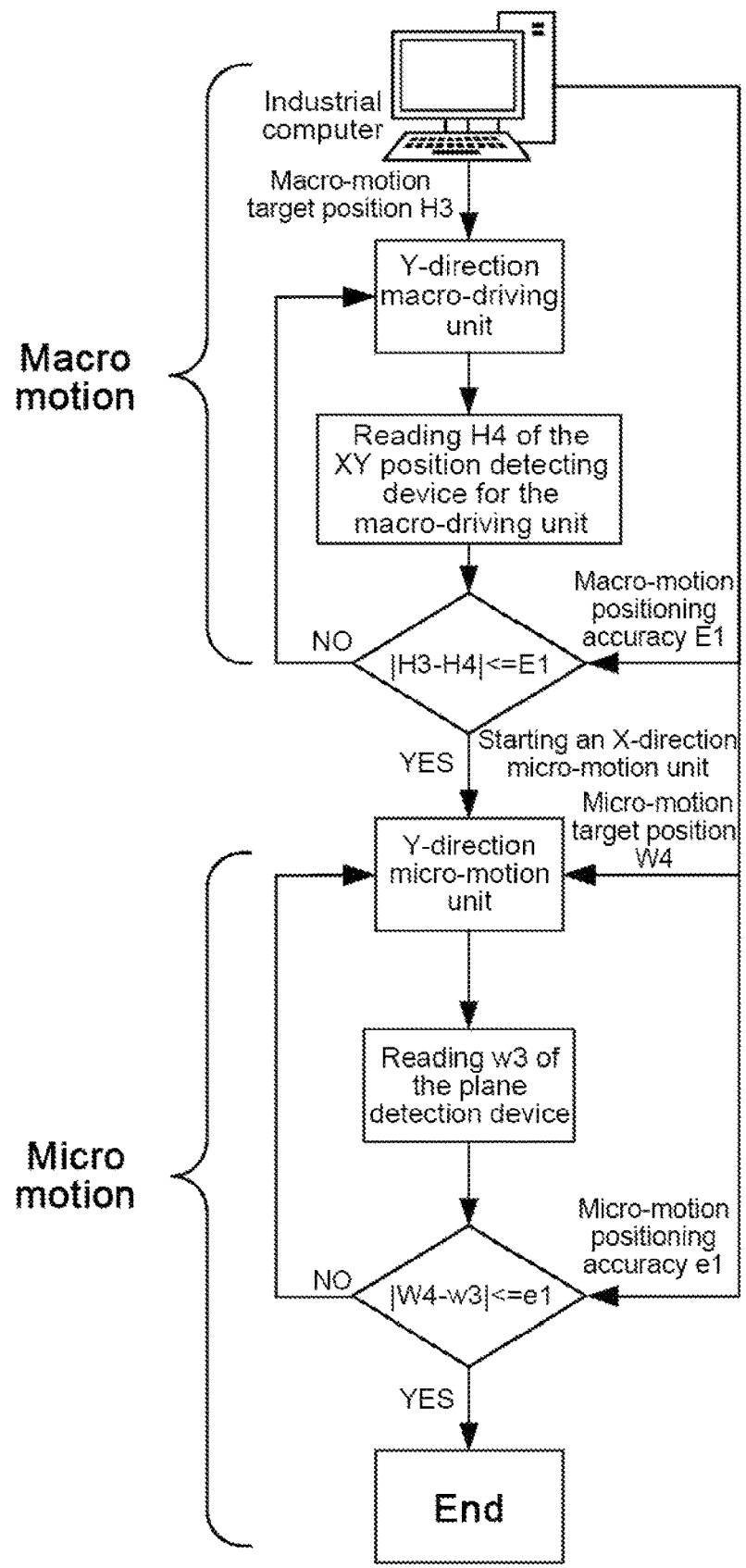
FIG. 5 is a flow chart of a Y-direction macro-micro fine positioning process according to an embodiment of the present disclosure.

In an embodiment, in step (S2), the fine positioning of the Y-direction micro-motion unit along the Y-direction is performed through the following steps, as shown in FIG. 5.

A final Y-direction position is D2=H3+W3. The Y-direction macro-driving unit 22 is controlled to move to a Y-direction macro motion target position H3 set by the industrial computer 4. An actual position H4 is acquired through the Y-direction macro-driving unit 22. When an absolute value of a difference between the target position H3 and the actual position H4 is within an accuracy range E1, the Y-direction macro-driving unit stops moving, and the fine positioning is performed on the Y-direction micro-motion unit.

When the absolute value of the difference between the target position H3 and the actual position H4 is outside the accuracy range E1, the Y-direction macro-driving unit keeps moving until the absolute value of the difference between the target position H3 and the actual position H4 is within the accuracy range E1.

When the Y-direction micro-motion unit 12 is turned on, the Y-direction micro-driving unit is controlled by the industrial computer to move to a Y-direction micro target position W1 set. An actual position W3 is acquired through the XY position detecting device. When an absolute value of a difference between the target position W3 and the actual position W4 is within an accuracy range e1, the Y-direction micro-driving unit stops moving. When the absolute value of the difference between the target position W3 and the actual position W4 is outside the accuracy range e1, the Y-direction micro-driving keeps moving until the absolute value of the difference between the target position W3 and the actual position W4 is within the accuracy range e1.

The technical principles of the present disclosure are illustrated in detail above with reference to the embodiments. It should be noted that these embodiments are only illustrative, and are not intended to limit the present disclosure. It should be understood that any modifications, changes and replacements made by those skilled in the art without departing from the spirit and scope of the disclosure shall fall within the scope of the present disclosure defined by the appended claims.

What is claimed is:
1. An XY macro-micro motion stage, comprising:
a fine-adjusting assembly;
a macro-driving assembly; and
an XY position detecting device;
wherein the fine-adjusting assembly comprises an X-direction micro-motion unit, a Y-direction micro-motion unit and a micro-motion unit bearing structure;
the X-direction micro-motion unit and the Y-direction micro-motion unit both have a driving function; an output end of the X-direction micro-motion unit has a loading function and is connected to the XY position detecting device; the X-direction micro-motion unit is configured to drive a load and the XY position detecting device to move along an X-axis direction; an output end of the Y-direction micro-motion unit is connected to the X-direction micro-motion unit; and the Y-direction micro-motion unit is configured to drive the X-direction micro-motion unit to move along a Y-axis direction;

the macro-driving assembly comprises an X-direction macro-driving unit, a Y-direction macro-driving unit, an X-direction mounting plate and a Y-direction mounting plate;

two ends of the X-direction mounting plate are respectively connected with the Y-direction macro-driving unit, to drive the X-direction mounting plate to move along the Y-axis direction; the micro-motion unit bearing structure is movably connected to a middle portion of the X-direction mounting plate; and a first moving pair extending along the X-axis direction is formed between the X-direction mounting plate and the micro-motion unit bearing structure;

two ends of the Y-direction mounting plate are respectively provided with the X-direction macro-driving unit to drive the Y-direction mounting plate to move along the X-axis direction; the micro-motion unit bearing structure is movably connected to a middle portion of the Y-direction mounting plate; and a first moving pair extending along the Y-axis direction is formed between the Y-direction mounting plate and the micro-motion unit bearing structure;

the XY position detecting device is configured to acquire a full-stroke and online closed-loop two-dimensional position information of the XY macro-micro motion stage on an X axis and a Y axis in real time under a combined driving of the X-direction macro-driving unit, the X-direction micro-motion unit, the Y-direction macro-driving unit and the Y-direction micro-motion unit;

the X-direction micro-motion unit comprises an X-direction micro-motion block with a moving function;

the Y-direction micro-motion unit comprises a Y-direction micro-motion block with a moving function;

the X-direction micro-motion block is connected to the XY position detecting device, and is provided with an X-direction limit head; the Y-direction micro-motion block is provided with a first micro-motion limit groove; the micro-motion unit bearing structure is provided with a second micro-motion limit groove; and the X-direction limit head extends into and is movable in the first micro-motion limit groove and the second micro-motion limit groove;

the X-direction micro-motion block and the Y-direction micro-motion block are movably connected; a second moving pair extending along the X-axis direction is formed between the X-direction micro-motion block and the Y-direction micro-motion block; the Y-direction micro-motion block is movably connected with the micro-motion unit bearing structure; a second moving pair extending along the Y-axis direction is formed between the Y-direction micro-motion block and the micro-motion unit bearing structure;

the XY position detecting device comprises a measuring data receiving device and a measuring data transmitting device;

the measuring data receiving device is arranged on the X-direction micro-motion block, and is movable inside and/or outside a surface of the measuring data transmitting device; the measuring data receiving device is movable on the surface of the measuring data transmitting device to acquire a position of the measuring data receiving device on an X axis and Y axis of the measuring data transmitting device; and the X-direction micro-motion block is provided with a top limit end with a bearing function at an upper end of the X-direction limit head; and the measuring data receiving device is arranged at a lower end of the X-direction limit head.

2. The XY macro-micro motion stage of claim 1, wherein a bottom of the top limit end abuts against an upper surface of the Y-direction micro-motion block; and a bottom of the Y-direction micro-motion block abuts against an upper surface of the micro-motion unit bearing structure.

3. The XY macro-micro motion stage of claim 1, wherein the measuring data receiving device and the measuring data transmitting device are in contact with each other through planes arranged opposite to each other.

4. The XY macro-micro motion stage of claim 1, further comprising:
an industrial computer;
wherein the industrial computer is in communication connection with the XY position detecting device; the industrial computer is configured to control the X-direction micro-motion unit, the Y-direction micro-motion unit, the X-direction macro-driving unit and the Y-direction macro-driving unit.

5. A method for controlling the XY macro-micro motion stage of claim 1 based on end feedback, comprising:
(S1) controlling, by an industrial computer, the X-direction macro-driving unit and the Y-direction macro-driving unit to realize a coarse positioning of a macro motion of the X-direction micro-motion unit along the X-axis direction and the Y-axis direction; and
(S2) feeding a precise position information acquired by the XY position detecting device back to the industrial computer; and when an absolute value of a difference between a target position A' and an actual position A is outside an accuracy range, performing by the industrial computer, a fine positioning on a micro motion of the X-direction micro-motion unit along the X-axis direction and a micro motion of the Y-direction micro-motion unit along the Y-axis direction until the absolute value of the difference between the target position A' and the actual position A is within the accuracy range.

6. The method of claim 5, wherein in step (S2), the fine positioning of the micro motion of the X-direction micro-motion unit along the X-axis direction is performed through steps of:
setting, by the industrial computer, an X-direction macro-motion target position H1 to the X-direction macro-driving unit, and a designed control signal is inputted to allow the X-direction macro-driving unit to move; and reading an actual position H2 of the X-direction macro-driving unit; when an absolute value of a difference between the target position H1 and the actual position H2 is within an accuracy range E, keeping the X-direction macro-driving unit stationary, and starting the X-direction micro-motion unit to perform fine positioning; and when the absolute value of the difference between the target position H1 and the actual position H2 is outside the accuracy range E, keeping moving the X-direction macro-driving unit until the absolute value of the difference between the target position H1 and the actual position H2 is within the accuracy range E; and
when the X-directional micro-motion unit is started, setting, by the industrial computer, an X-direction micro target position W1 to the X-direction micro-motion unit; acquiring, by the measuring data receiving device, an actual position W2 of the X-direction micro-motion unit along the X-axis direction; when an absolute value of a difference between the target position W1 and the actual position W2 is within an accuracy range e, stopping moving the X-direction micro-motion unit; when the absolute value of the difference between the target position W1 and the actual position W2 is outside the accuracy range e, keeping moving the X-direction micro-driving unit until the absolute value of the difference between the target position W1 and the actual position W2 is within the accuracy range e.

7. The method of claim 5, wherein in step (S2), the fine positioning of the micro motion of the Y-direction micro-motion unit along the Y-axis direction is performed through steps of:
setting, by the industrial computer, a Y-direction macro-motion target position H3 to the Y-direction macro-driving unit, and a designed control signal is inputted to allow the Y-direction macro-driving unit to move; reading an actual position H4 of the Y-direction macro-driving unit; when an absolute value of a difference between the target position H3 and the actual position H4 is within an accuracy range E1, keeping the Y-direction macro-driving unit stationary, and starting the Y-direction micro-motion unit to perform fine positioning;
when the absolute value of the difference between the target position H3 and the actual position H4 is outside the accuracy range E1, moving the Y-direction macro-driving unit until the absolute value of the difference between the target position H3 and the actual position H4 is within the accuracy range E1; and
when the Y-direction micro-motion unit is started, setting, by the industrial computer, a Y-direction micro-motion target position W3 to the Y-direction micro-motion unit; acquiring, by the XY position detecting device, an actual position W4 of the Y-direction micro-motion unit along the Y-axis direction; when an absolute value of a difference between the target position W3 and the actual position W4 is within an accuracy range e1, stopping moving the Y-directional micro-motion unit; and when the absolute value of the difference between the target position W3 and the actual position W4 is outside the accuracy range e1, keeping moving the Y-direction micro-motion unit until the absolute value of the difference between the target position W3 and the actual position W4 is within the accuracy range e1.

* * * * *